US008330163B2

(12) United States Patent
Chen et al.

(10) Patent No.: US 8,330,163 B2
(45) Date of Patent: Dec. 11, 2012

(54) ACTIVE DEVICE ARRAY MOTHER SUBSTRATE AND METHOD OF FABRICATING DISPLAY PANEL

(75) Inventors: Yu-Mou Chen, Tainan County (TW); Wen-Bin Hsu, Miaoli County (TW); Chih-Yao Chao, Hsinchu (TW); Tsung-Yi Hsu, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 290 days.

(21) Appl. No.: 12/634,700

(22) Filed: Dec. 10, 2009

(65) Prior Publication Data
US 2011/0049521 A1    Mar. 3, 2011

(30) Foreign Application Priority Data
Sep. 1, 2009 (TW) ................................ 98129453 A

(51) Int. Cl.
*H01L 29/04* (2006.01)
(52) U.S. Cl. ............................................ 257/59; 257/72
(58) Field of Classification Search ................ 257/59, 257/72
See application file for complete search history.

(56) References Cited

U.S. PATENT DOCUMENTS

| 6,956,634 | B2 | 10/2005 | Kim et al. | |
| 2008/0188023 | A1 | 8/2008 | Shin et al. | |
| 2008/0291145 | A1* | 11/2008 | Chen et al. | 345/92 |
| 2008/0296591 | A1* | 12/2008 | Lin et al. | 257/88 |

* cited by examiner

Primary Examiner — Jenny L Wagner
Assistant Examiner — Mark Tornow
(74) Attorney, Agent, or Firm — Jianq Chyun IP Office

(57) ABSTRACT

An active device array mother substrate including a substrate, pixel arrays, and a polymer-stabilized alignment curing circuit is provided. The substrate has panel regions, a circuit region, a first cutting line, and a second cutting line. The first cutting line is disposed on the circuit region between an edge of the substrate and the second cutting line. The active devices of the pixel arrays have a semiconductor layer. The polymer-stabilized alignment curing circuit disposed on the circuit region includes curing pads disposed between the edge of the substrate and the first cutting line and curing lines having an upper conductive layer connected to the corresponding curing pads and the corresponding pixel array. The upper conductive layer is in the same layer as the source/drain conductor. Therefore, the curing lines are capable of preventing problems such as peeling, so as to keep the polymer-stabilized alignment curing circuit operating normally.

10 Claims, 11 Drawing Sheets

ACTIVE DEVICE ARRAY MOTHER SUBSTRATE AND METHOD OF FABRICATING DISPLAY PANEL

CROSS-REFERENCE TO RELATED APPLICATION

This application claims the priority benefit of Taiwan application serial no. 98129453, filed Sep. 1, 2009. The entirety of the above-mentioned patent application is hereby incorporated by reference herein and made a part of specification.

BACKGROUND OF THE INVENTION

1. Field of the Invention

The invention relates to a substrate and a method of fabricating a display apparatus, and more particularly relates to an active device array mother substrate and a method of fabricating a display panel.

2. Description of Related Art

With the increase in computing power and the rapid development of internet and multimedia technologies, sizes of video or image apparatuses are miniaturized gradually. In the development of displays, along with the progress in optoelectronic technology and semiconductor fabrication technology, liquid crystal displays (LCDs) with superior features such as high definition, great space utilization, low power consumption, and no radiation have slowly become the mainstream of the market.

LCDs characterized by high contrast ratio, no gray scale inversion, little color shift, high luminance, full color, high color saturation, high responsive speed, and wide viewing angles are required in the market. At this current stage, displays such as twisted nematic (TN) LCDs equipped with wide viewing films, in-plane switching (IPS) LCDs, fringe field switching LCDs, multi-domain vertical alignment (MVA) displays and so on have been developed to satisfy the requirement of wide viewing angle.

In a conventional MVA-LCD panel, an alignment structure is disposed so that the liquid crystal (LC) molecules in different areas tilt in different angles and achieve the wide viewing angle effect. Here, the alignment structure includes the alignment protrusions located on the electrode or the alignment slits of the electrode. However, the light leakage arisen from tilt disclination of the LC molecules surrounding the alignment protrusions and the alignment slits leads to a reduction in a display contrast ratio of the LCD. To prevent light leakage, a light shielding layer corresponding to the alignment protrusions or the alignment slits is additionally disposed. Nevertheless, an aperture ratio of the display is limited thereby. Hence, a polymer-stabilized alignment (PSA) aiming at forming multi-domain alignment has been proposed, so as to resolve the issue regarding the unfavorable contrast ratio of the MVA-LCD panel.

The polymer-stabilized alignment (PSA) method needs to dope reactive monomers into the LC layer and applies a curing predetermined voltage thereto. The LC layer is irradiated by a light under the curing predetermined voltage. The reactive monomers are then polymerized and cured to form a polymer layer simultaneously on the substrate at respective sides of the LC layer.

Traditionally, the curing predetermined voltage applied is transmitted to the pixel arrays via a curing line disposed outside of a display region of the active device array mother substrate. Moreover, in conventional curing lines, the curing lines are fabricated from a layer that is formed simultaneously with a gate of the active device. However, when carrying out the subsequent process of the active device array mother substrate (such as the doping process), this curing line is easily affected by the following doping process and peels off from the substrate, such that the curing predetermined voltage can not be transmitted to the pixel arrays in the display region. As a consequence, the LC layer on the entire substrate can not be cured and aligned successfully, thereby severely affecting the yield rate and the fabrication of PSA-LCDs. Hence, how to improve the design of PSA curing circuit becomes one of the issues to be overcome urgently in the fabrication of PSA-LCDs.

SUMMARY OF THE INVENTION

The invention is directed to an active device array mother substrate to solve issues such as peeling of curing lines of a polymer-stabilized alignment (PSA) curing circuit in a fabrication process.

The invention is directed to a method of fabricating a display panel. The method prevents curing lines from being affected by a doping process of pixel arrays, thereby solving issues such as peeling of the curing lines of a PSA curing circuit in the fabrication process.

An active device array mother substrate is provided in the invention. The active device array mother substrate includes a substrate, a plurality of pixel arrays, and a PSA curing circuit. The substrate has a plurality of panel regions, a circuit region connected to the panel regions, a first cutting line, and a second cutting line, wherein the panel regions are also named panel predetermined regions. The second cutting line aligns with an edge of the panel regions. The first cutting line is disposed on the circuit region between an edge of the substrate and the second cutting line. Each pixel array is disposed within each panel region and has a plurality of active devices arranged in an array. The active devices include a semiconductor layer, a gate insulation layer, a gate electrode layer, a first dielectric layer, and a source drain layer, which is a layer of a source conductor and a drain conductor. The semiconductor layer is disposed on the substrate. The gate insulation layer covers the semiconductor layer. The gate electrode layer is disposed on the gate insulation layer above the semiconductor layer. The first dielectric layer covers the gate electrode layer. The first dielectric layer and the gate insulation layer have a plurality of openings jointly exposing a portion of the semiconductor layer. The source conductor and the drain conductor are disposed on the first dielectric layer and connected to the semiconductor layer via the openings in the first dielectric layer and the gate insulation layer, respectively. Moreover, the PSA curing circuit is disposed on the circuit region and includes a plurality of curing pads and a plurality of curing lines. The curing pads are disposed between the edge of the substrate and the first cutting line. Particularly, the curing lines have an upper conductive layer which is connected to the corresponding curing pads and the corresponding pixel array. The upper conductive layer is in the same layer as the source conductor and the drain conductor. For instance, the semiconductor layer is a poly-silicon layer or an amorphous silicon layer.

According to an embodiment of the invention, the first dielectric layer is further disposed on the circuit region and each curing line includes the first dielectric layer disposed between the upper conductive layer and the substrate.

According to an embodiment of the invention, each curing line further includes a via structure, and the via structure is comprised of metal, for example. The via structure is neighboring to the corresponding pixel array, and the upper conductive layer of each curing line is electrically connected to the corresponding pixel array via the via structure. More specifically, the first dielectric layer is further disposed within the via structures. The via structures include a lower conductive layer. Here, the lower conductive layer and the gate electrode layer may be formed in the same layer, and the upper conductive layer, the first dielectric layer, and the lower conductive layer constitute the via structures. In each via structure, the first dielectric layer has a contact opening exposing the lower conductive layer, and the upper conductive layer is connected to the lower conductive layer via the contact opening.

According to an embodiment of the invention, each pixel array further includes a plurality of pixel electrodes electrically connected to the corresponding active device respectively. In addition, the pixel electrodes and the curing pads are electrically connected.

According to an embodiment of the invention, each curing pad includes a dielectric pattern, a first conductive pattern, and a second conductive pattern. In specific, the dielectric pattern is disposed on the substrate. The dielectric pattern of the curing pad and the first dielectric layer of the active devices may be formed in the same layer. The first conductive pattern is disposed on the dielectric pattern. The first conductive pattern, the source conductor and the drain conductor may be formed in the same layer. The second conductive pattern is disposed on the first conductive pattern. The second conductive pattern and the pixel electrodes may be formed in the same layer. It should be noted that the PSA curing circuit further includes a second dielectric layer. The second dielectric layer covers the curing lines and exposes the second conductive pattern of each curing pad.

According to an embodiment of the invention, the semiconductor layer includes a plurality of semiconductor islands each having a channel region, a source region and a drain region, where the source region and the drain region are disposed on respective sides of the channel region. The source regions and the drain regions are made of doped poly-silicon, for example. In details, in each active device, the openings of the first dielectric layer and the gate insulation layer are disposed on respective sides of the gate electrode layer, and the openings of the first dielectric layer and the gate insulation layer jointly expose the source region and the drain region. The source conductor and the drain conductor are electrically connected to the source region and the drain region in each poly-silicon island respectively via the openings of the first dielectric layer and the gate insulation layer. For instance, the semiconductor islands are poly-silicon islands or amorphous silicon islands.

According to an embodiment of the invention, a width of the curing lines substantially ranges from about 200 micrometer (µm) to about 10000 µm.

A method of fabricating a display panel is further provided in the invention. The method of fabricating the display panel includes the following steps. Firstly, an active device array mother substrate is provided. A method of forming the active device array mother substrate includes first providing a substrate, for example. The substrate has a plurality of panel regions, a circuit region connected to the panel regions, a first cutting line, and a second cutting line. The second cutting line aligns with an edge of the panel regions. The first cutting line is disposed on the circuit region between an edge of the substrate and the second cutting line. Thereafter, a plurality of pixel arrays is respectively formed in the panel regions of the substrate and a PSA curing circuit is formed on the circuit region. More specifically, each pixel array formed in the aforementioned step has a plurality of active devices arranged in an array. The PSA curing circuit includes a plurality of curing pads and a plurality of curing lines. The curing pads are formed between the edge of the substrate and the first cutting line. The curing lines are connected to the corresponding curing pads and the corresponding pixel array. In the steps aforementioned, a method of forming the active devices and the PSA curing circuit includes the following. Firstly, a semiconductor layer is formed on the substrate of each panel region. The semiconductor layer includes a plurality of semiconductor islands. Afterwards, a gate insulation layer is formed to cover the semiconductor layer. Next, a gate electrode layer is further formed on the gate insulation layer above the semiconductor layer. Subsequently, a doping process is performed to form a source region, a drain region, and a channel region located between the source region and the drain region in each semiconductor island. Then, a first dielectric layer is formed to cover the gate electrode layer. Here, the first dielectric layer and the gate insulation layer have a plurality of openings respectively exposing a portion of the source region and the drain region. After the doping process is carried out, a source conductor, a drain conductor and an upper conductive layer are simultaneously formed. The source conductor and the drain conductor are formed on the first dielectric layer and electrically connected to the source region and the drain region of each semiconductor island respectively via the openings of the first dielectric layer. The upper conductive layer is formed on the circuit region. The upper conductive layer formed between the edge of the substrate and the first cutting line constitutes the curing pads, and the upper conductive layer connected between the corresponding curing pads and the corresponding pixel array constitutes the curing lines. For instance, the semiconductor layer is a poly-silicon layer or an amorphous silicon layer, and the semiconductor islands are poly-silicon islands or amorphous silicon islands.

After the active device array mother substrate is formed, an opposite substrate parallel to the active device array mother substrate is provided. Later, a liquid crystal (LC) layer is formed between the active device array mother substrate and the opposite substrate. The LC layer includes a plurality of polymerizable monomers distributed therein. Afterwards, a curing predetermined voltage is inputted to the curing pads. The curing predetermined voltage is transmitted to the corresponding pixel array via the upper conductive layer of the curing lines, so as to generate a voltage difference with the opposite substrate. The polymerizable monomers tilt an angle according to the voltage difference. An ultraviolet light is then provided to irradiate the LC layer tilted. The substrate is cut along the second cutting line to form a plurality of display panel. More specifically, the ultraviolet light is provided to irradiate the LC layer tilted with the angle. Subsequently, the curing pads are removed along the first cutting line and the panel regions are separated along the second cutting line, so that each display panel is formed corresponding to each related panel region.

According to an embodiment of the invention, the method of fabricating a display panel further comprising cutting the substrate along the first cutting line.

In light of the foregoing, the curing lines are formed in the same layer as the source conductor and the drain conductor of the active devices in the active device array mother substrate of the invention. Therefore, the curing lines are prevented from being affected by the doping process during fabrication, thereby solving the issues such as peeling of the curing lines in the PSA curing circuit. Furthermore, in the method of fabricating the display panel of the invention, the upper conductive layer constituting the curing lines and the source conductor and the drain conductor of the active devices are formed after the doping proves. As a consequence, the curing lines are prevented from being affected by the doping process of the pixel arrays, so that the problems of the peeling of the curing lines and the like can be solved for the PSA curing circuit to operate normally.

In order to make the aforementioned and other features and advantages of the invention more comprehensible, embodiments accompanied with figures are described in detail below.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention.

DESCRIPTION OF EMBODIMENTS

The invention is directed to a polymer-stabilized alignment (PSA) curing circuit disposed on an active device array mother substrate. In existing fabrication processes, for the consideration of circuit layout on a substrate and the buffering of impacts from various processes to curing lines, the active device array mother substrate in the invention adopts a suitable layer as curing lines to avoid an effect of a subsequent process, such as a doping process, on conventional curing lines, thereby preventing the peeling of the curing lines. In a method of fabricating a display panel of the invention, a forming process of curing lines is performed after a doping process of active devices, so that the peeling of conventional curing lines can be solved effectively.

To better elaborate the curing lines and the active device array mother substrate adopting the curing lines in the invention, several embodiments are accompanied with figures to further illustrate the invention in detail.

Figure 1:
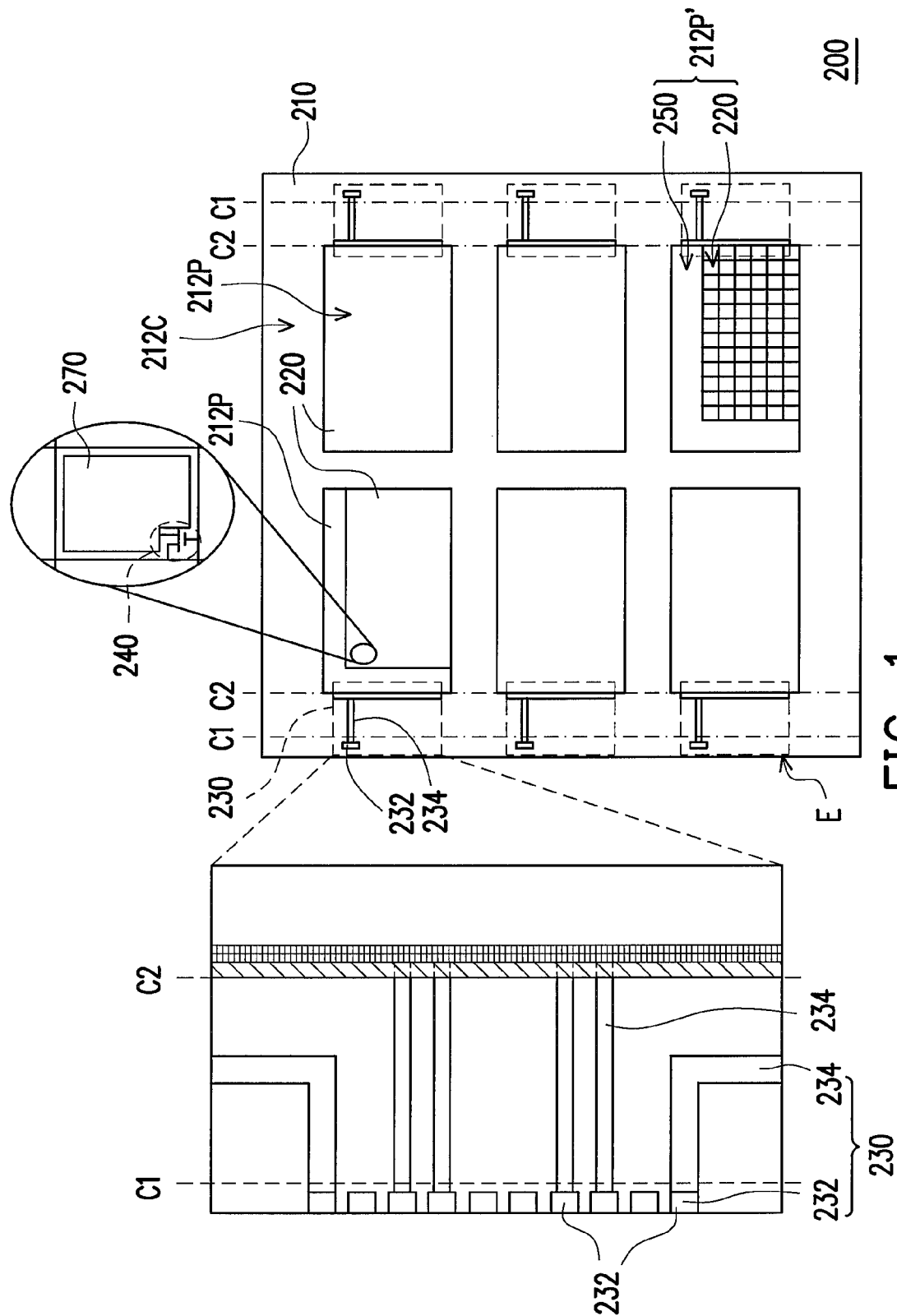
FIG. 1 is a schematic view of an active device array mother substrate according to an embodiment of the invention.

FIG. 1 is a schematic view of an active device array mother substrate according to an embodiment of the invention. Referring to FIG. 1, an active device array mother substrate 200 includes a substrate 210, a plurality of pixel arrays 220 disposed on the substrate 210, and a PSA curing circuit 230. As illustrated in FIG. 1, the surface of the substrate 210 is divided into, for example, a plurality of panel regions 212P and a circuit region 212C connected to the panel regions 212P depending on the product, wherein the panel regions 212P are also named panel predetermined regions. The substrate 210 has a first cutting line C1 and a second cutting line C2. The second cutting line C2 aligns with an edge of at least one panel region 212P. The first cutting line C1 is disposed on the circuit region 212C between an edge of the substrate 210 and the second cutting line C2.

Moreover, each pixel array 220 is disposed within each panel region 212P and has a plurality of active devices 240 arranged in an array. As shown in FIG. 1, a plurality of PSA curing circuits 230 corresponding to each pixel array 220 is disposed on the circuit region 212C of the substrate 210. The PSA curing circuit 230 includes a plurality of curing pads 232 and a plurality of curing lines 234. The curing pads 232 are disposed between an edge E of the substrate 210 and the first cutting line C1. It should be noted that the curing lines 234 have an upper conductive layer 234A (illustrated in FIG. 2A). The upper conductive layer 234A (illustrated in FIG. 2A) of the curing lines 234 is connected to the corresponding curing pads 232 and the corresponding pixel array 220. Before introducing layer structures of the curing lines 234 and the active devices 240, a layout of each component on the active device array mother substrate is first illustrated.

Specifically, a panel region 212P' indicated in FIG. 1 is used as an example to illustrate the range of the panel regions 212P. The panel region 212P' includes the pixel array 220 and a driving circuit region 250 which is the area around the pixel array 220 or a portion of the area around the pixel array 220. The driving circuit region 250 is disposed between the pixel arrays 220 and the circuit region 212C. In details, when the active device array mother substrate 200 is predetermined to fabricate display panels, the pixel arrays 220 are then respectively disposed in a display region of one display panel to display images.

More specifically, as shown in an enlarged view in FIG. 1, each pixel array 220 includes a plurality of pixel electrodes 270 electrically connected to the corresponding active device 240 respectively. The curing pads 232 (i.e. RGB curing pads) are electrically connected to the pixel electrodes 270, for example. In addition, if the curing pads 232 are gate curing pads (or common curing pads), the curing pads 232 are electrically connected to gate electrode lines (or common lines). In a process of PSA curing, the PSA curing circuit 230 is configured to transmit a curing predetermined voltage to the corresponding pixel array 220, so as to generate an electrical field between the pixel array 220 and an opposite electrode array. As a consequence, the polymerizable molecules of the LC layer become a polymer layer to make the LC molecules have a pre-tilted angle after curing processes such as irradiation. In the signal transmission pathway, when performing a PSA LC monomer curing process, the curing pads 232 in the PSA curing circuit 230 may directly contact with an external source, for example, to receive a curing predetermined voltage inputted by the external source. This curing predetermined voltage is then transmitted to the corresponding pixel arrays 220 via the curing lines 234. The active device array mother substrate 200 utilizes an upper conductive layer 234A (illustrated in FIG. 2A), which is formed in the same layer as the source conductor 246S and the drain conductor 246D (illustrated in FIG. 2A) of the active devices 240, to fabricate the curing lines 234. The peeling of conventional curing lines can therefore be solved.

The active device array mother substrate 200 illustrated in FIG. 1 is used as an example in the following. Several embodiments are shown and layers of the curing lines 234 and layers of the active devices 240 are described in detail. Illustrations are presented in the following with reference to FIG. 2A and FIG. 2B. In order to clarify relative positions among the curing lines, layer structures of active devices, and the layers, a stacking relationship and a relative position of each layer is merely schematically illustrated in FIGS. 2A and 2B.

Figure 2A:
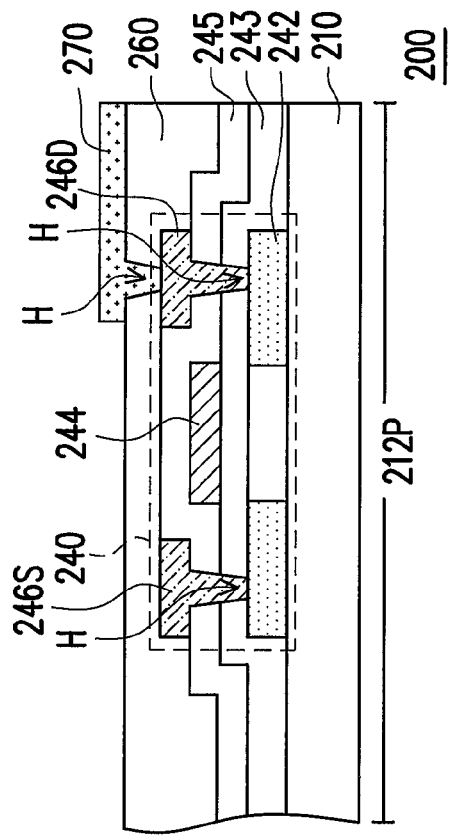
FIG. 2A and FIG. 2B are respectively schematic partial cross-sectional views depicting an active device array mother substrate according to an embodiment of the invention.
Figure 2A:
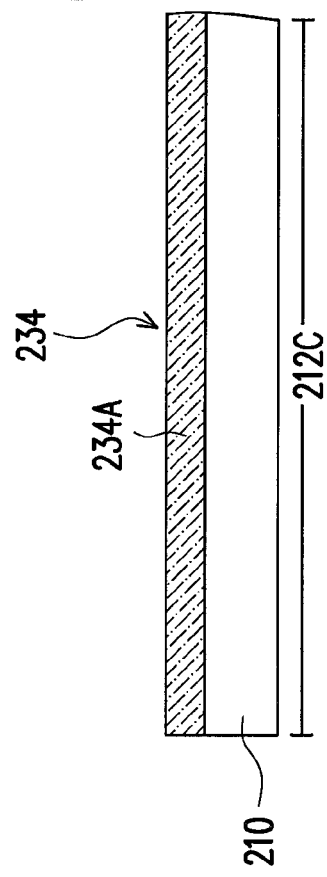

Referring to FIG. 1 and FIG. 2A, particularly, the upper conductive layer 234A of the curing lines 234 and the source conductor 246S and the drain conductor 246D in the active devices 240 may be formed in the same layer. A layer structure of the curing lines 234 and the active devices 240 are depicted as follows.

Referring to FIG. 2A, the active device 240 has a semiconductor layer 242, and in the present embodiment, the semiconductor layer 242 is a poly-silicon layer. As such, each active device 240 is, for example, a top-gate poly-silicon thin film transistor (TFT). That is, the active device 240 is generally constituted by a semiconductor layer 242, a gate insulation layer 243, a gate electrode layer 244, a first dielectric layer 245, a source conductor 246S and a drain conductor 246D. It should be noted that poly-silicon is merely one example of the materials of the semiconductor layer 242. This invention is not limited the materials of the semiconductor. As shown in FIG. 2A, the semiconductor layer 242 is disposed on the substrate 210. The gate insulation layer 243 covers the semiconductor layer 242. The gate electrode layer 244 is disposed on the gate insulation layer 243 above the semiconductor layer 242. The first dielectric layer 245 covers the gate electrode layer 244. Moreover, the first dielectric layer 245 and the gate insulation layer 243 have a plurality of openings H jointly exposing a portion of the semiconductor layer 242. The source conductor 246S and the drain conductor 246D are disposed on the first dielectric layer 245 and electrically connected to the semiconductor layer 242 via the openings H of the first dielectric layer 245 and the gate insulation layer 243. On the other hand, as shown in FIG. 2A, the curing line 234 is constituted by the upper conductive layer 234A. The upper conductive layer 234A of the curing line 234 are in the same layer as the source conductor 246S and the drain conductor 246D of the active device 240, and are thus illustrated by the same pattern in FIG. 2A. The same layer means that the upper conductive layer 234A, the source conductor 246S and the drain conductor 246D are fabricated by the same process, for example, the same process using the same mask. Therefore, although the upper conductive layer 234A, the source conductor 246S and the drain conductor 246D have planes of different heights, the two layers can still be referred to be in the same layer.

Figure 2B:
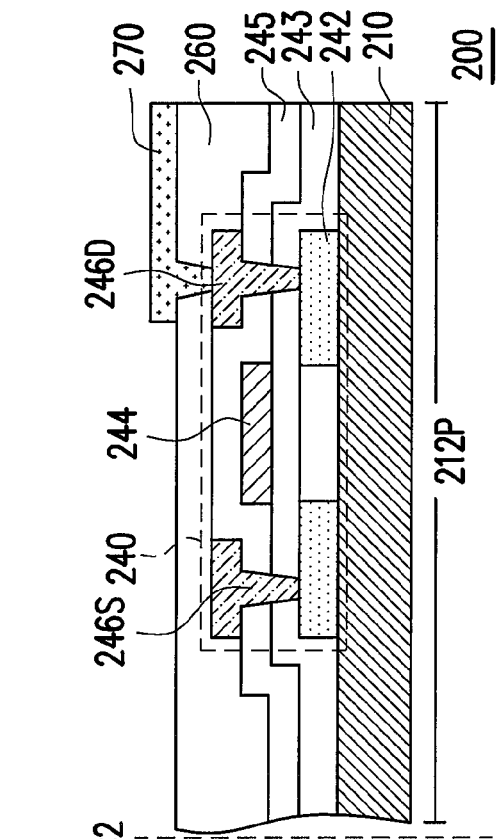
Figure 2B:
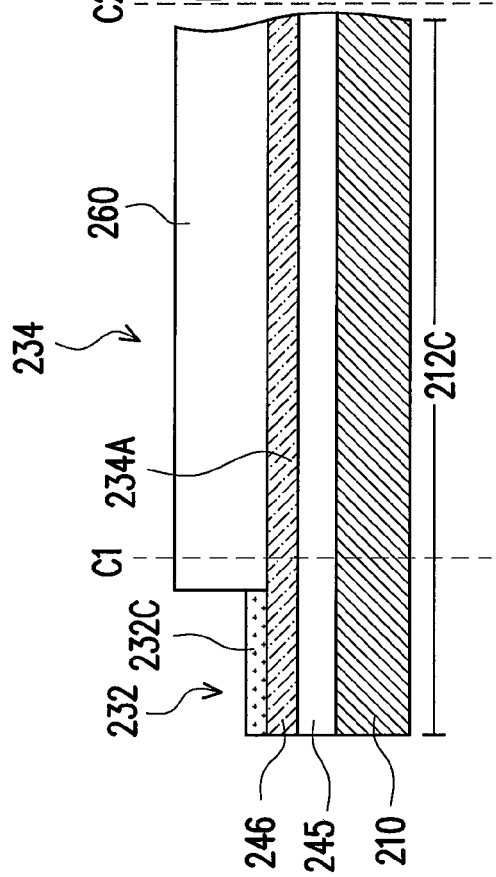

FIG. 2B is a schematic cross-sectional view of the curing line 234 and the active device 240 according to another embodiment of the invention. Referring to FIG. 2B, in the consideration of further protecting the structure of the curing line 234, the second dielectric layer 260 configured to cover the active device 240 can be further covered on the upper conductive layer 234A of the curing line 234, as illustrated in FIG. 2B. Obviously, in the consideration of other design demands, such as increasing adhesive strength, preventing impurities in the substrate 210 from diffusing into the upper conductive layer 234A to affect the signal transmission efficiency, the first dielectric layer 245 may be further disposed between the upper conductive layer 234A of the curing line 234 and the substrate 210. In other words, a layer-forming region of the first dielectric layer 245 is disposed in the active device 240 in the panel region 212P and expands to the curing line 234 in the circuit region 212C. Consequently, each curing line 234 includes the first dielectric layer 245 disposed between the upper conductive layer 234A and the substrate 210. Furthermore, the topmost layer of the curing pad 232 illustrated in FIG. 2B is second conductive pattern 232C, for example, which is in the same layer as the pixel electrode 270. While performing a polymer-stabilized alignment (PSA) curing process, a predetermined voltage is transmitted to the corresponding pixel electrode 270 through the second conductive pattern 232C of the curing pad 232.

To illustrate the fabricating method more clearly, the active device array mother substrate 200 shown in FIG. 2B is used as an example to explain the method of fabricating the curing line and the active device. Illustrations are presented in the following with reference to FIGS. 3A~3E.

Figure 3A:
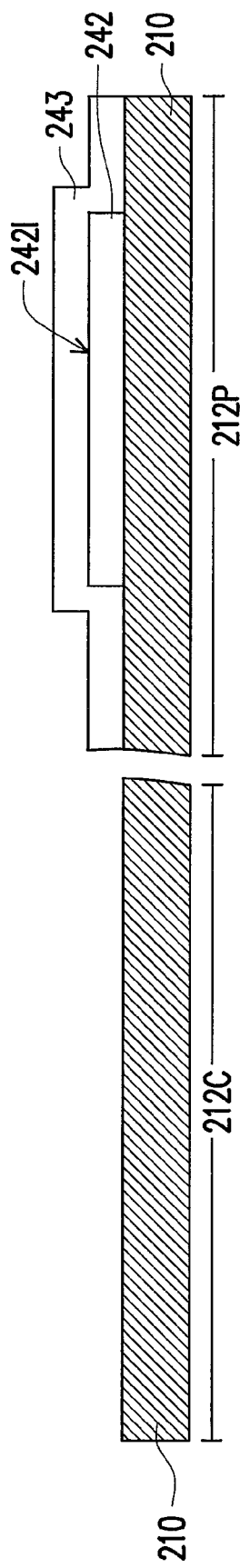
FIGS. 3A~3E illustrate a method of fabricating an active device array mother substrate according to an embodiment of the invention.

Referring to FIG. 3A, a semiconductor layer 242 is formed on the substrate 210 of each panel region 212P. The semiconductor layer 242 may be a poly-silicon layer, and has a plurality of semiconductor islands, and the semiconductor islands 242I are poly-silicon islands in the present embodiment. In other words, in the present embodiment, the semiconductor layer 242 has a plurality of semiconductor islands 242I. In FIG. 3A, only one semiconductor island 242I is schematically illustrated as an example. Next, a gate insulation layer 243 is formed on the semiconductor layer 242 to cover the semiconductor island 242I.

Figure 3B:
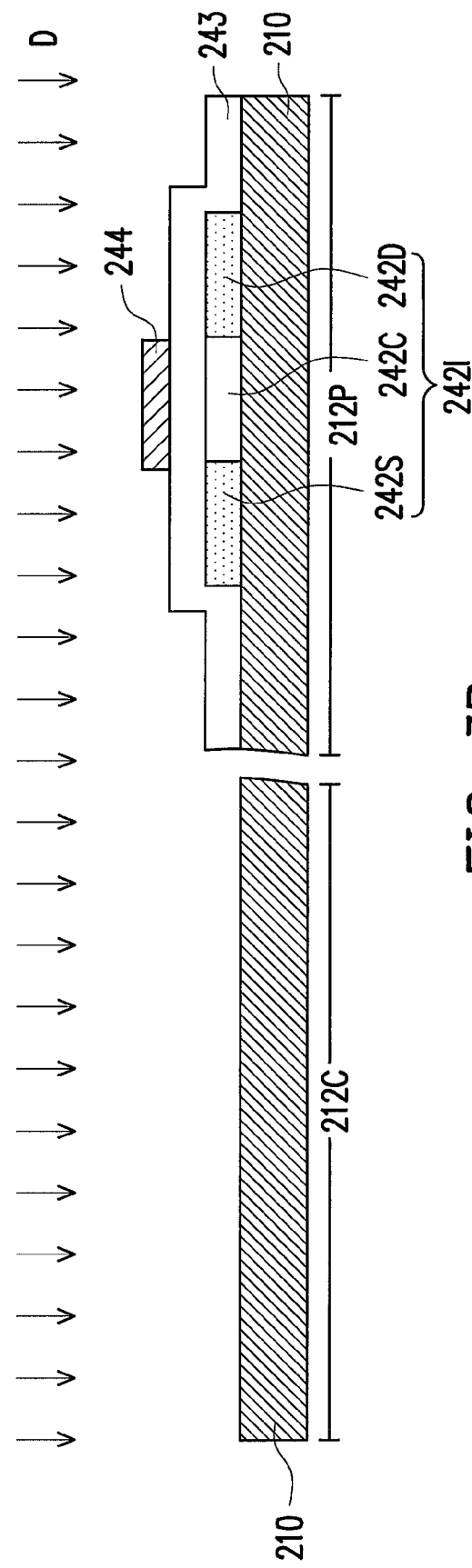

Referring to FIG. 3B, a gate electrode layer 244 is formed on the gate insulation layer 243, and the gate electrode layer 244 is located above the semiconductor island 242I. Subsequently, a doping process D is performed to form a source region 242S, a drain region 242D, and a channel region 242C located between the source region 242S and the drain region 242D. The course region 242S and the drain region 242D are made of doped poly-silicon, for example. It should be noted that, at this time, the curing line 234 (shown in FIG. 2B) disposed on the circuit region 212C has not yet been formed. Thus, adverse effects are prevented from the unlayered curing line when performing the doping process D which has more impact in the fabricating process of the active device 240.

Figure 3C:
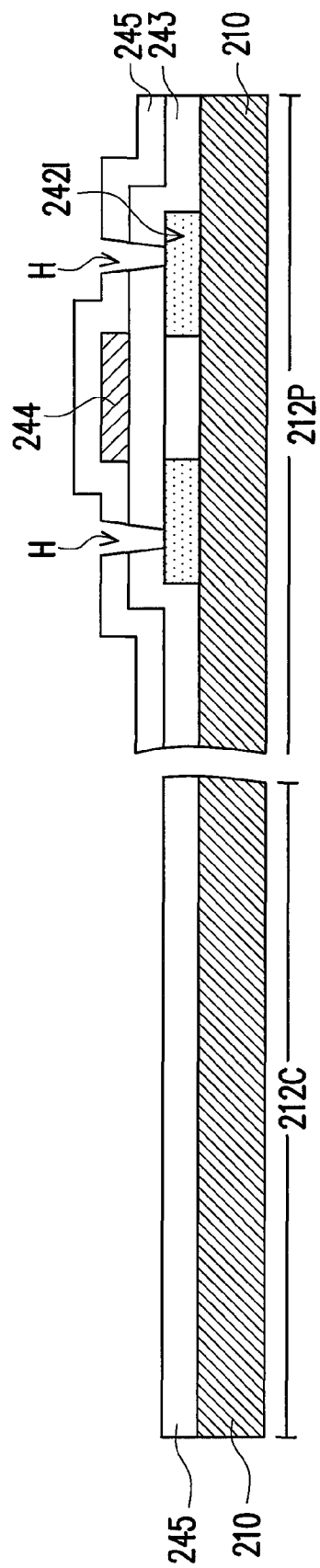

Thereafter, as depicted in FIG. 3C, a first dielectric layer 245 is formed on the gate insulation layer 243 to cover the gate electrode layer 244. In the present embodiment, the first dielectric layer 245 is simultaneously formed in a region predetermined to form the curing line 234 in the circuit region 212C. Moreover, the first dielectric layer 245 and the gate insulation layer 243 have a plurality of openings H respectively exposing a portion of the source region 242S and the drain region 242D.

Figure 3D:
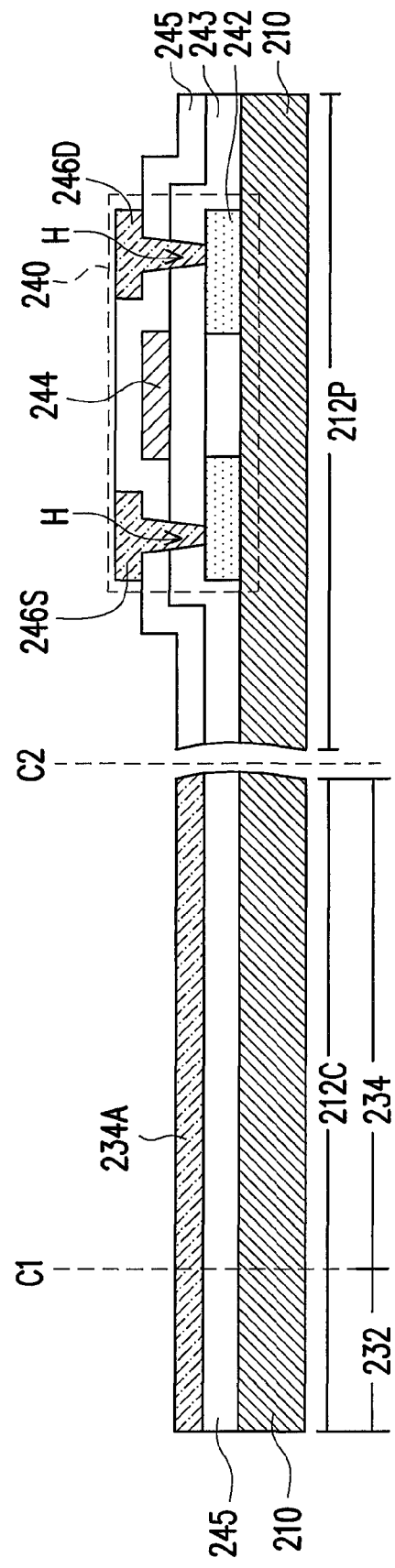

Next, as shown in FIG. 3D, the source conductor 246S and the drain conductor 246D are formed on the first dielectric layer 245. The upper conductive layer 234A is formed on the region predetermined to form the curing line 234. The source conductor 246S and the drain conductor 246D are electrically connected to the source region 242S and the drain region 242D in each semiconductor island 242I respectively via the openings H of the first dielectric layer 245. The source conductor 246S is connected to the source region 242S of each semiconductor island 242I via the opening H of the first dielectric layer 245. The drain conductor 246D is connected to the drain region 242D of each semiconductor island 242I via another opening H of the first dielectric layer 245. On the other hand, the upper conductive layer 234A formed between the edge of the substrate 210 and the first cutting line C1 constitutes the curing pad 232. Moreover, the upper conductive layer 234A connected between the corresponding curing pad 232 and the corresponding pixel array 220 constitutes the curing line 234. It should be noted that in the actual fabricating process, the upper conductive layer 234A of the curing line 234 in the circuit region 212C is formed after the doping process D of the active device 240. Thus, even when the doping process D, which has more impact to the layer, is performed on the active device array mother substrate 200, the upper conductive layer 234A formed after would not affected.

Figure 3E:
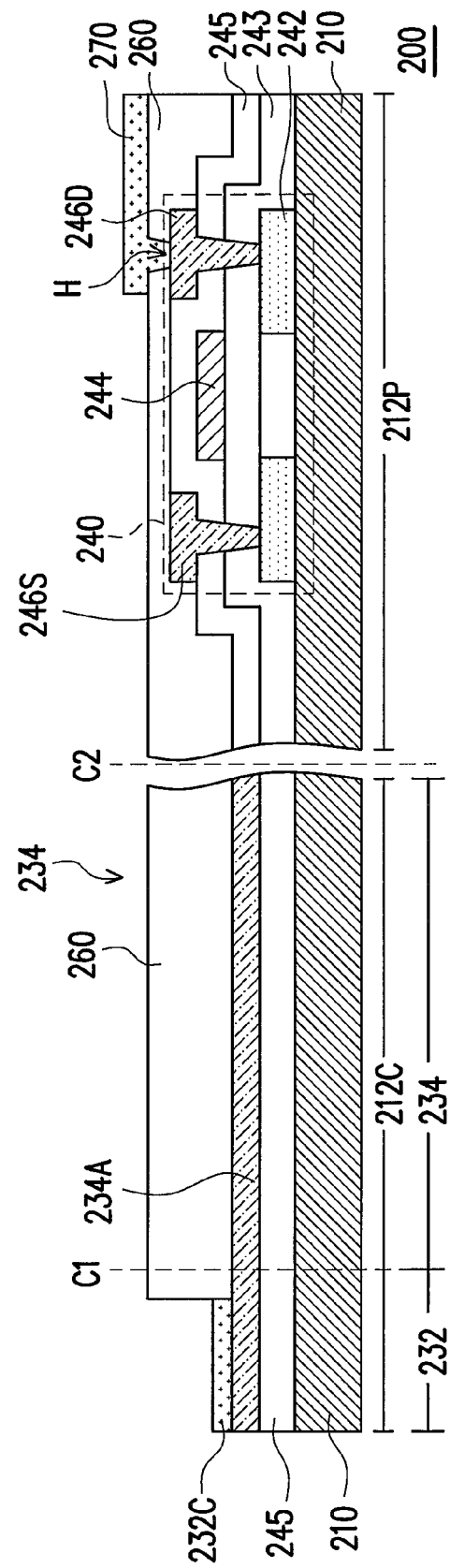

As illustrated in FIG. 3E, a second dielectric layer 260 is formed on the active device 240 and the curing line 234. The second dielectric layer 260 has an opening H exposing the drain conductor 246D. Thereafter, the pixel electrode 270 is formed on the second dielectric layer. The pixel electrode 270 is connected to the drain conductor 246D via the opening H of the second dielectric layer 260. Furthermore, while forming the pixel electrode 270, the second conductive pattern 232C of the curing pad 232 is simultaneously formed the upper conductive layer 234A.

Since the upper conductive layer 234A configured to transmit signals on the curing line 234 may be formed in the same layer as the source conductor 246S and the drain conductor 246D of the active device 240, in the practical fabricating process, the upper conductive layer 234A, the source conductor 246S and the drain conductor 246D are formed after the doping process of the active device 240. Hence, the upper conductive layer 234A of the curing line 234 is prevented from an impact of dopant molecules in the doping process, so as to solve the peeling problem of the curing line 234.

Figure 4:
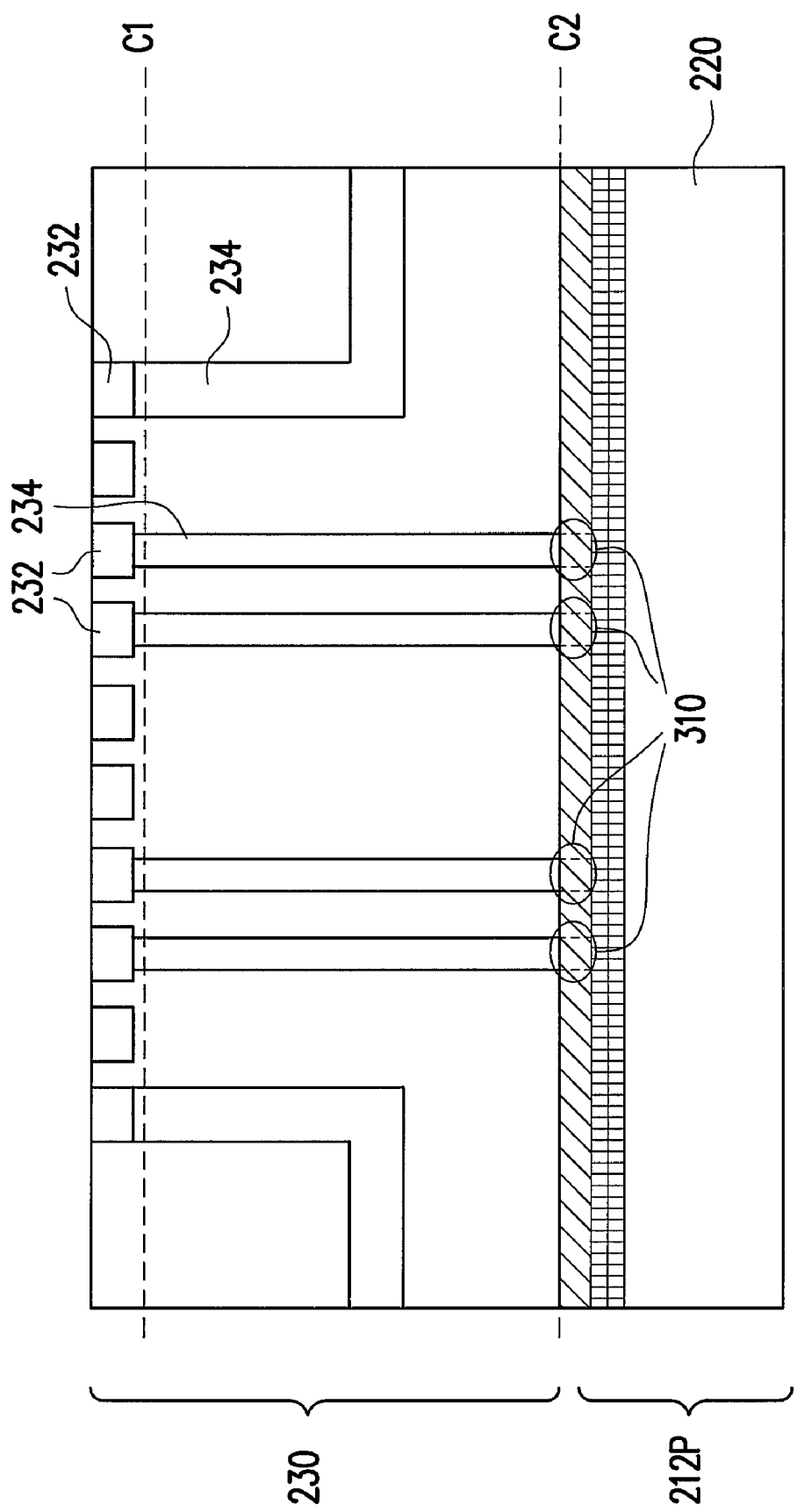
FIG. 4 is a schematic view of a polymer-stabilized alignment curing circuit on an active device array mother substrate according to an embodiment of the invention.

In order to describe the active device array mother substrate of the invention more specifically, FIG. 4 is presented to illustrate a layout of the PSA curing circuit in detail.

FIG. 4 is a schematic diagram of the PSA curing circuit on the active device array mother substrate according to an embodiment of the invention. FIG. 4 is a partial enlarged schematic view of the PSA curing circuit 230 disposed on the circuit region in FIG. 1. Referring to FIG. 4, the curing pads 232 on the PSA curing circuit 230 are disposed between the edge of the substrate 210 and the first cutting line C1. After the completion of specific processes in the following, the curing pads 232 or other circuits are removed by cutting along the first cutting line C1. The curing lines 234 are generally disposed between the second cutting line C2 and the curing pads 232. If the active devices array mother substrate 200 is applied to manufacture the display panel(s), the panel regions 212P are separated by cutting the active devices array mother substrate 200 along the second cutting line C2 upon completion of most of the fabricating processes. As a result, each display panel is formed in each corresponding panel region 212P.

As shown in FIG. 4, each curing line 234 transmits a curing predetermined voltage from the curing pad 232 to the corresponding pixel array 220. In addition, in the present embodiment, the upper conductive layer 234A of the curing lines 234 is electrically connected to the pixel array 220 through a wire jumper design, for example. In details, each curing line 234 further includes a via structure 310. In this embodiment, the via structure 310 is comprised of metal, for example. The via structure 310 is neighboring to the corresponding pixel array 220. The upper conductive layer 234A of each curing line 234 is electrically connected to the pixel electrode 270 in the corresponding pixel array 220 via the via structure 310.

Figure 5:
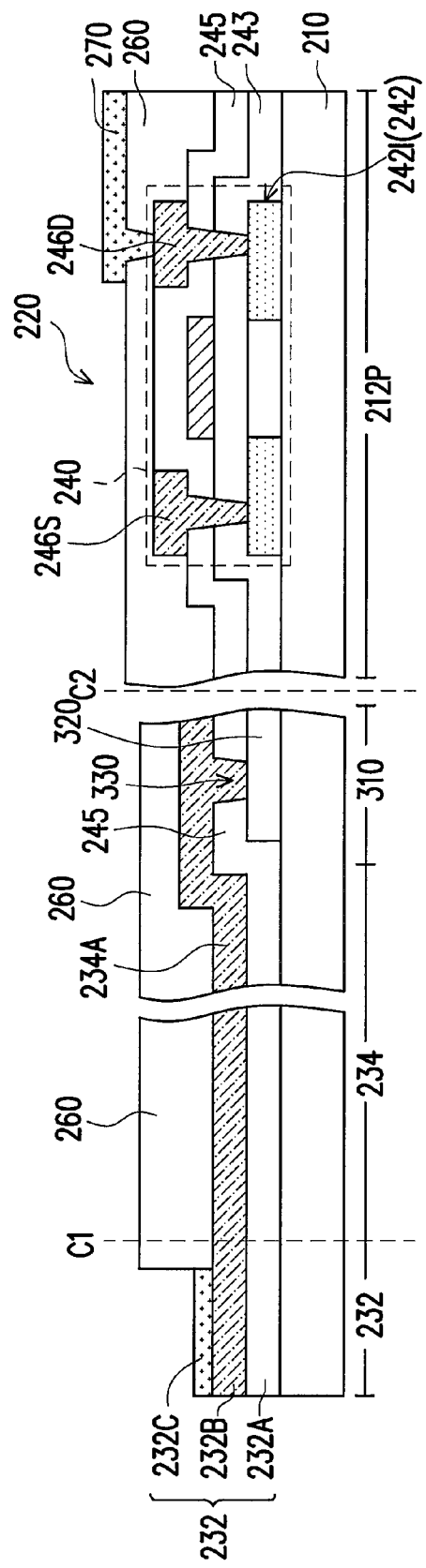
FIG. 5 is a schematic cross-sectional view illustrating a via structure in FIG. 4.

More specifically, FIG. 5 is a schematic cross-sectional view of the via structure in FIG. 4. FIG. 5 simultaneously depicts cross-sectional views of the curing pad 232, a pixel structure of one of the pixel arrays 220, and the via structure 310. Referring to FIG. 5, a structure of an embodiment of the via structure is described in detail. In the present embodiment, the first dielectric layer 245 is further disposed in the via structure 310. The via structure 310 has the lower conductive layer 320 which may be formed in the same layer as the gate electrode layer 244. The upper conductive layer 234A, the first dielectric layer 245, and the lower conductive layer 320 constitute the via structure 310. In each via structure 310, the first dielectric layer 245 has a contact opening exposing the lower conductive layer 320. The upper conductive layer 234A is connected to the lower conductive layer 320 via a contact opening 330.

In the following, a structure of an embodiment of the curing pad 232 is illustrated as shown in FIG. 5. In the present embodiment, each curing pad 232 includes a dielectric pattern 232A, a first conductive pattern 232B, and a second conductive pattern 232C. The second conductive pattern 232C is formed selectively. That is, the dielectric pattern 232A is disposed on the substrate 210. The dielectric pattern 232A and the first dielectric layer 245 are in the same layer. In other word, in the present embodiment, the dielectric pattern 232A of the curing pad 232, the first dielectric layer 245 of the curing line 234, and the first dielectric layer 245 of the active device 240 may be formed in the same layer and may be fabricated by the same masking process. As shown in FIG. 5, the first conductive pattern 232B is disposed on the dielectric pattern 232A. The first conductive pattern 232B of the curing pad 232, the upper conductive layer 234A of the curing line 234, the source conductor 246S and the drain conductor 246D of the active device 240 are fabricated by the same masking process so as to be in the same layer. The second conductive pattern 232C is disposed on the first conductive pattern 232B. The second conductive pattern 232C and the pixel electrode 270 are fabricated by the same process using the same mask so as to be in the same layer. Notably, as aforementioned, the PSA curing circuit 230 further includes a second dielectric layer 260. The second dielectric layer 260 covers the curing lines 234 and exposes the second conductive pattern 232C of each curing pad 232. In the present embodiment, a width of the curing lines 234 substantially ranges from about 200 micrometer (μm) to about 10000 μm.

The active device array mother substrate 200 illustrated in FIG. 1 and FIG. 2B is used as an example to depict a method of fabricating a display panel by using an active device array mother substrate. Illustrations are presented as follows with reference to FIGS. 6A~6D and FIG. 1.

Figure 6A:
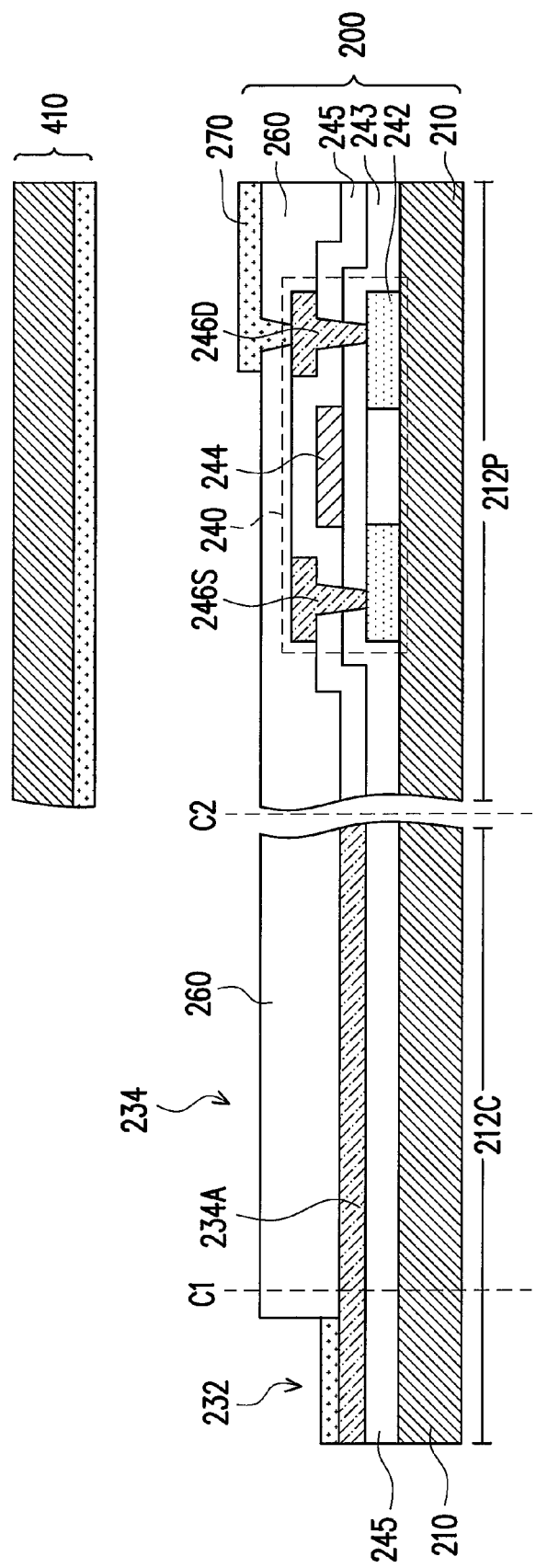
FIGS. 6A~6D illustrate a method of fabricating a display panel according to an embodiment of the invention.

Firstly, referring to FIG. 6A and FIG. 1, an active device array mother substrate 200 is provided. A method of forming the active device array mother substrate 200 includes the following. A substrate 210, a plurality of panel regions 212P predetermined thereon, a circuit region 212C connected to the panel regions 212P, a first cutting line C1, and a second cutting line C2 is provided. The second cutting line C2 aligns with an edge of at least one panel region 212P. The first cutting line C1 is disposed on the circuit region 212C between an edge of the substrate 210 and the second cutting line C2.

Thereafter, a plurality of pixel arrays 220 is respectively formed in the panel regions 212P of the substrate 210 and a PSA curing circuit 230 is formed on the circuit region 212C. Particularly, the formations of the pixel arrays 220 and the PSA curing circuit 230 can be the same as the methods illustrated in FIG. 3A~3E aforementioned, and thus no further description is provided herein. After the active device array mother substrate 200 is formed, an opposite substrate 410 parallel to the active device array mother substrate 200 is provided.

Figure 6B:
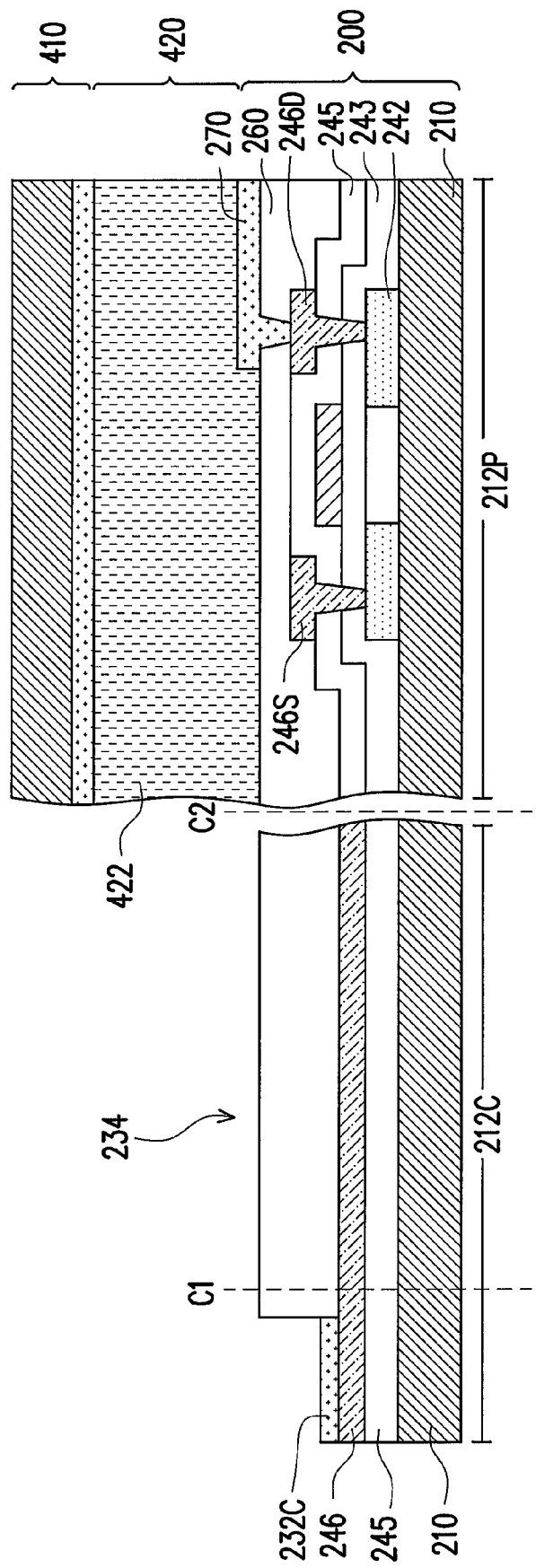

Later, as illustrated in FIG. 6B, an LC layer 420 is formed between the active device array mother substrate 200 and the opposite substrate 410. The LC layer 420 includes a plurality of polymerizable monomers 422 distributed therein.

Figure 6C:
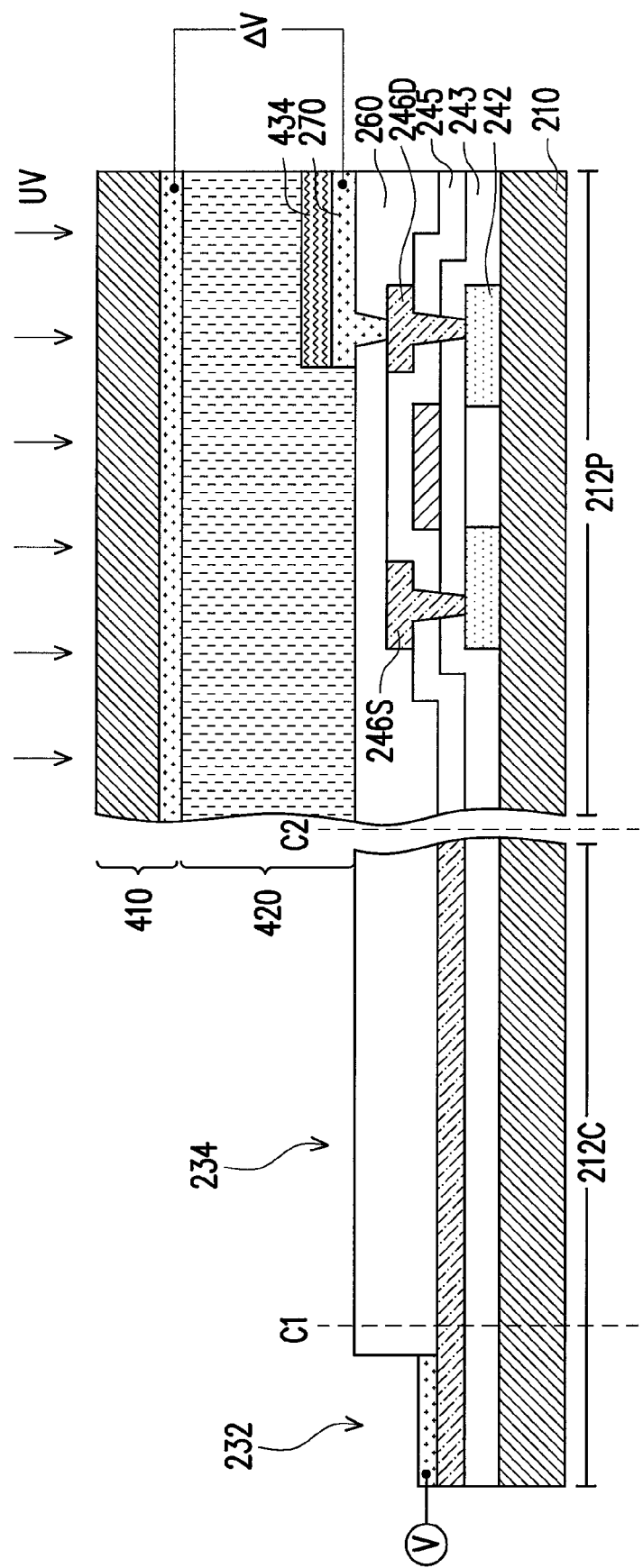

Afterwards, as shown in FIG. 6C, a curing predetermined voltage V is inputted from the curing pad 232. The curing predetermined voltage V is transmitted to the corresponding pixel array 220 via the upper conductive layer 234A of the curing line 234, so as to generate a voltage difference $\Delta V$ with the opposite substrate 410. The polymerizable monomers 422 and/or LC monomers tilt a specific angle in response to the voltage difference ΔV. This angle is an included angle between a major axis of LC molecules and the substrate. Additionally, an ultraviolet light UV is provided to irradiate the LC layer 420, so that the polymerizable monomers 422 of the LC layer 420 have a polymerization reaction. As a consequence, the polymerizable monomers 422 in the LC layer form an polymer layer 434 to make the LC monomers has a pretilted angle according to the tilted angle aforementioned.

Figure 6D:
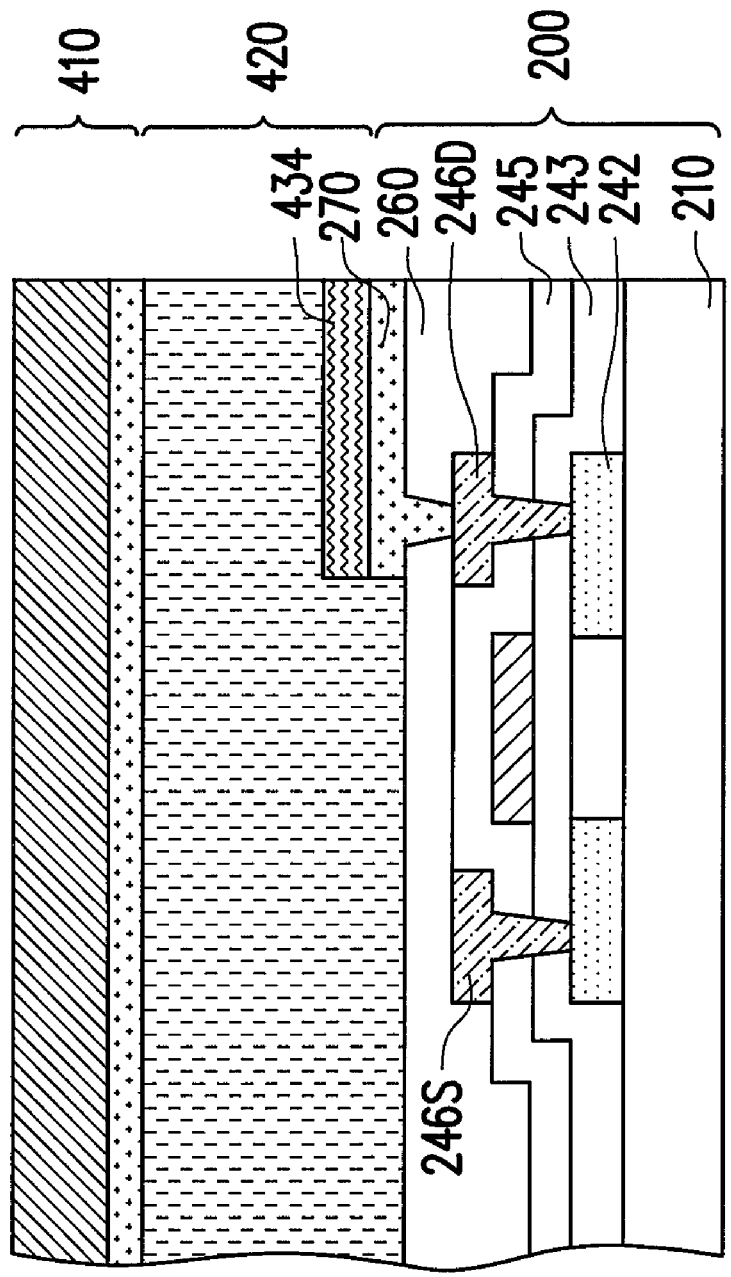

Subsequently, as shown in FIG. 6D, after the curing pad 232 is removed along the first cutting line C1 and the panel regions 212P are separated by cutting the active device array mother substrate 200 along the second cutting line C2, each display panel is formed in each corresponding panel region 212P. Here, the steps of cutting the active device array mother substrate 200 along the first cutting line C1 and the second cutting line C2 can be performed simultaneously or sequentially. That is, the cutting step of the first cutting line C1 is followed by the cutting step of the second cutting line C2 or vice versa, and the invention is not limited thereto. Hence, by selecting a suitable layer as the curing lines 234 of the PSA curing circuit 230, the peeling of curing lines 234 is prevented to enhance the production yield rate of the display panel under conventional fabrication processes.

In summary, the active device array mother substrate and the method of fabricating the display panel of the invention both take the fabrication factors into consideration, such that the curing lines and the source conductor and the drain conductor of the active devices are designed to be formed in the same layer. Since the upper conductive layer of the curing lines is formed after the doping process of the active devices, the curing lines are effectively prevented from being damaged by the doping process, so the normal operation of the PSA curing circuit is maintained. Hence, the conventional fabrication processes can be applied to perform the curing alignment process conveniently, thereby enhancing the production yield rate.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An active device array mother substrate, comprising:
   a substrate, having a plurality of panel regions, a circuit region connected to the plurality of panel regions, a first cutting line, and a second cutting line, wherein the second cutting line aligns with an edge of the panel regions and the first cutting line is located in the circuit region between an edge of the substrate and the second cutting line;
   a plurality of pixel arrays, wherein each pixel array is disposed within each panel region and has a plurality of active devices arranged in an array, and the plurality of active devices comprises:
      a semiconductor layer, disposed on the substrate, the semiconductor layer comprising a polysilicon structure having a doped source region, a doped drain region and a channel region between the doped source region and the doped drain region;
      a gate insulation layer, covering the semiconductor layer;
      a gate electrode layer, disposed on the gate insulation layer above the semiconductor layer;
      a first dielectric layer, covering the gate electrode layer, wherein the first dielectric layer and the gate insulation layer have a plurality of openings exposing a portion of the semiconductor layer; and
      a source conductor and a drain conductor, disposed on the first dielectric layer and electrically connected to the semiconductor layer, wherein the source conductor and the drain conductor pass through the first dielectric layer and the gate insulation layer to be in contact with the doped source region and the doped drain region respectively; and
   a polymer-stabilized alignment curing circuit, disposed on the circuit region, wherein the polymer-stabilized alignment curing circuit comprises:
      a plurality of curing pads, disposed between the edge of the substrate and the first cutting line; and
      a plurality of curing lines, having an upper conductive layer connected to the corresponding curing pads and the corresponding pixel array and the first dielectric layer being located between the substrate and the upper conductive layer, wherein the upper conductive layer is in a same layer as the source conductor and the drain conductor.

2. The active device array mother substrate as claimed in claim 1, wherein each curing line further comprises a via structure neighboring the corresponding pixel array, and the upper conductive layer of each curing line is electrically connected to the corresponding pixel array via the via structure.

3. The active device array mother substrate as claimed in claim 2, wherein the first dielectric layer is further disposed within the plurality of via structures and the plurality of via structures has a lower conductive layer, wherein the lower conductive layer is in a same layer as the gate electrode layer, and the upper conductive layer, the first dielectric layer, and the lower conductive layer constitute the plurality of via structures, so that in each via structure, the first dielectric layer has a contact opening exposing the lower conductive layer, and the upper conductive layer is connected to the lower conductive layer via the contact opening.

4. The active device array mother substrate as claimed in claim 1, wherein each pixel array further comprises a plurality of pixel electrodes electrically connected to the corresponding active device respectively, and the plurality of pixel electrodes and the plurality of curing pads are electrically connected.

5. The active device array mother substrate as claimed in claim 4, wherein each curing pad comprises:
   a dielectric pattern, disposed on the substrate, wherein the dielectric pattern and the first dielectric layer are in a same layer;
   a first conductive pattern, disposed on the dielectric pattern and being in a same layer as the source conductor and the drain conductor; and
   a second conductive pattern, disposed on the first conductive pattern and being in a same layer as the plurality of pixel electrodes.

6. The active device array mother substrate as claimed in claim 5, wherein the polymer-stabilized alignment curing circuit further comprises a second dielectric layer covering the plurality of curing lines and exposing the second conductive pattern of each curing pad.

7. The active device array mother substrate as claimed in claim 1, wherein the semiconductor layer comprises a plurality of poly-silicon islands each having a channel region, a source region and a drain region, the source region and the drain region disposed on respective sides of the channel region, and a material of the plurality of source regions and the plurality of drain regions comprises doped poly-silicon.

8. The active device array mother substrate as claimed in claim 7, wherein in each active device, the plurality of openings of the first dielectric layer and the gate insulation layer is disposed on respective sides of the gate electrode layer, the plurality of openings of the first dielectric layer and the gate insulation layer jointly expose the source region and the drain region, and the source conductor and the drain conductor are electrically connected to the source region and the drain region in each poly-silicon island respectively via the plurality of openings of the first dielectric layer and the gate insulation layer.

9. The active device array mother substrate as claimed in claim 1, wherein a width of the plurality of curing lines substantially ranges from 200 micrometer (μm) to 10000 μm.

10. The active device array mother substrate as claimed in claim 1, wherein each panel region comprises one of the plurality of pixel arrays and a driving circuit region located in the periphery of the pixel array, and the plurality of driving circuit regions is disposed between the plurality of pixel arrays and the circuit region.

* * * * *